US009449842B2

(12) United States Patent
Ishimaru et al.

(10) Patent No.: US 9,449,842 B2
(45) Date of Patent: Sep. 20, 2016

(54) PLASMA ETCHING METHOD

(71) Applicant: Hitachi High-Technologies Corporation, Minato-ku, Tokyo (JP)

(72) Inventors: Masato Ishimaru, Tokyo (JP); Takahiro Abe, Tokyo (JP); Makoto Suyama, Tokyo (JP); Takeshi Shimada, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/447,615

(22) Filed: Jul. 31, 2014

(65) Prior Publication Data
US 2015/0194315 A1 Jul. 9, 2015

(30) Foreign Application Priority Data
Jan. 7, 2014 (JP) .................................. 2014-000708

(51) Int. Cl.
*H01L 21/3065* (2006.01)
*H01L 21/3213* (2006.01)
*H01L 43/12* (2006.01)

(52) U.S. Cl.
CPC ......... *H01L 21/32131* (2013.01); *H01L 43/12* (2013.01)

(58) Field of Classification Search
USPC ................. 216/22, 41, 58, 67; 438/696, 710
See application file for complete search history.

(56) References Cited

U.S. PATENT DOCUMENTS

| | | | |
|---|---|---|---|
| 6,518,206 B1 * | 2/2003 | Kumar et al. ................. 438/585 |
| 7,572,386 B2 * | 8/2009 | Ventzek ............. H01J 37/3233 216/67 |
| 2002/0004309 A1 * | 1/2002 | Collins et al. ................. 438/719 |
| 2003/0143858 A1 * | 7/2003 | Mathuni et al. .............. 438/710 |
| 2004/0129361 A1 * | 7/2004 | Chen et al. ..................... 156/58 |
| 2013/0048599 A1 * | 2/2013 | Satake et al. ................... 216/22 |
| 2014/0299571 A1 * | 10/2014 | Sawataishi ....................... 216/17 |

FOREIGN PATENT DOCUMENTS

| | | |
|---|---|---|
| EP | 0 753 885 A1 | 1/1997 |
| EP | 0 820 093 A1 | 1/1998 |
| JP | 09-237777 A | 9/1997 |
| JP | 10-098029 A | 4/1998 |
| JP | 2001-196355 A | 7/2001 |
| JP | 2007-329205 A | 12/2007 |

* cited by examiner

*Primary Examiner* — Shamim Ahmed
(74) *Attorney, Agent, or Firm* — Miles & Stockbridge P.C.

(57) ABSTRACT

A plasma etching method for plasma etching a film to be etched to a size smaller than a prescribed size using a mask patterned to the prescribed size performs etching on the film to be etched to the size smaller than the prescribed size while forming a protection film on side walls of the film to be etched.

6 Claims, 9 Drawing Sheets

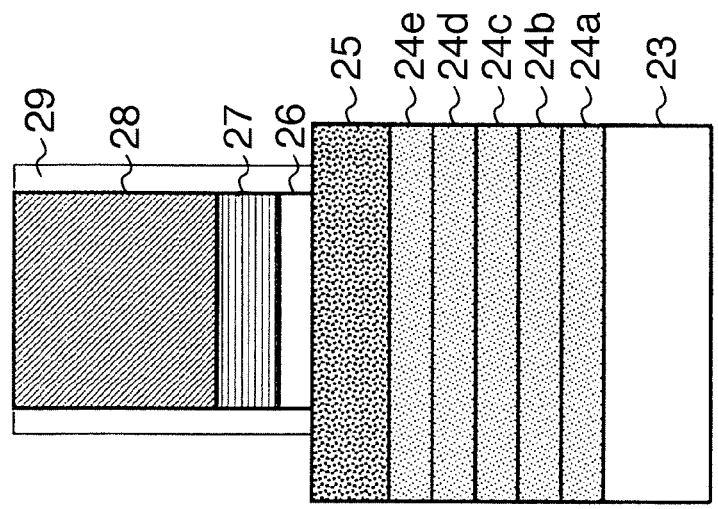
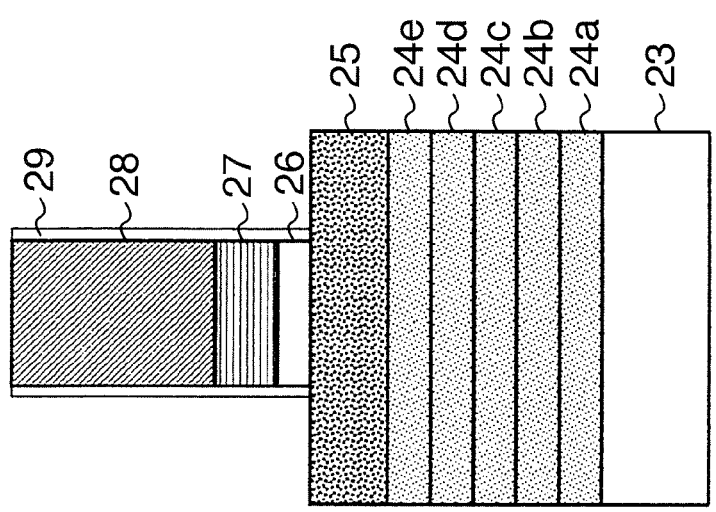
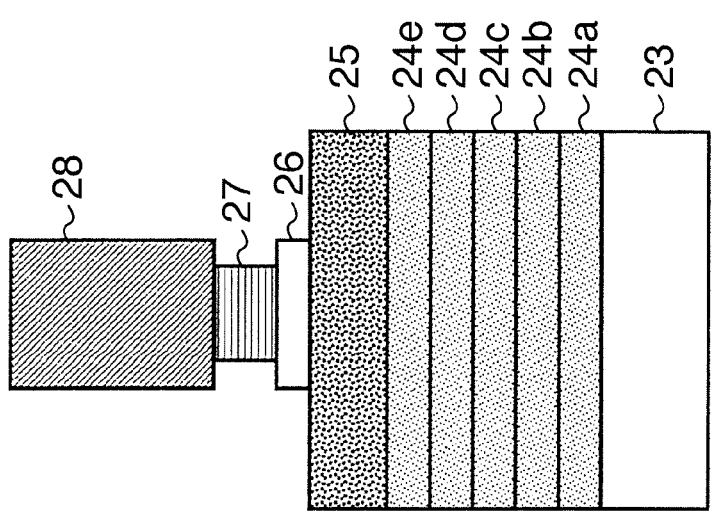

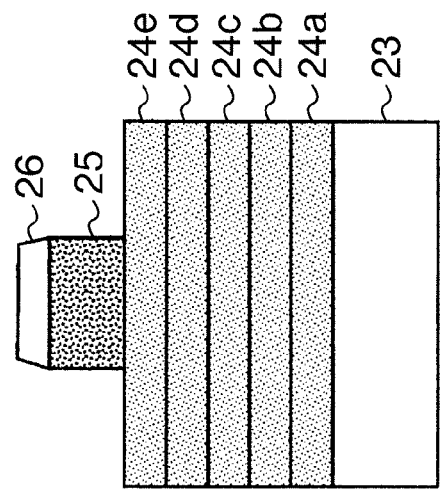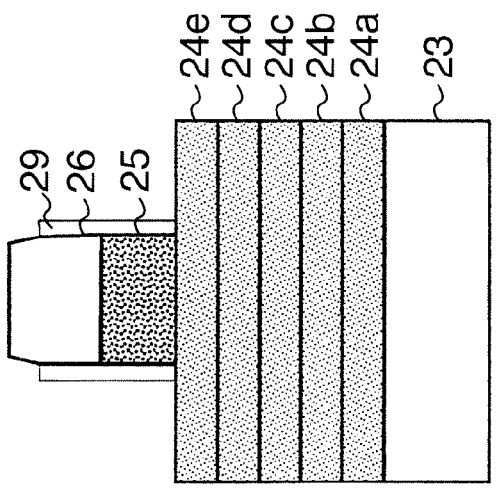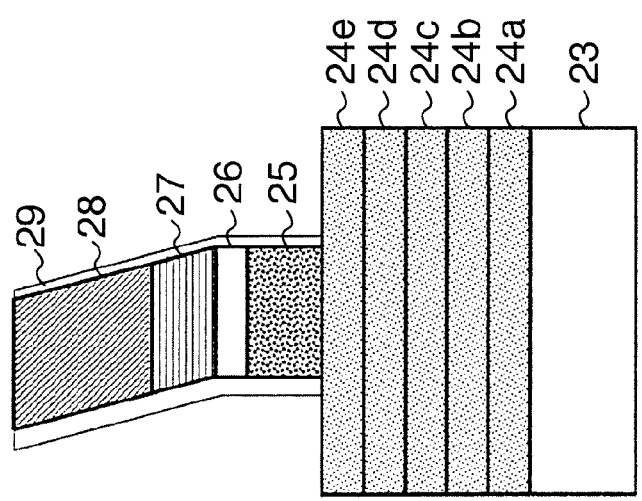

FIG. 12A

| GAS FLOW RATE (ml/min) | | PROCESSING PRESSURE | HIGH FREQUENCY BIAS POWER | FARADAY SHIELD VOLTAGE |
|---|---|---|---|---|
| $Cl_2$ | $O_2$ | (Pa) | (W) | (V) |
| 60 | 5 | 0.3 | 15 | 50 |

FIG. 12B

| GAS FLOW RATE (ml/min) | | | PROCESSING PRESSURE | HIGH FREQUENCY BIAS POWER | FARADAY SHIELD VOLTAGE |
|---|---|---|---|---|---|
| $Cl_2$ | $CF_4$ | He | (Pa) | (W) | (V) |
| 18 | 7 | 50 | 0.3 | 17 | 50 |

FIG. 12C

| STEP | GAS FLOW RATE (ml/min) | | | PROCESSING PRESSURE | HIGH FREQUENCY BIAS POWER | TEMPERATURE OF ELECTRODE 6 |
|---|---|---|---|---|---|---|
| | $O_2$ | Ar | $NH_3$ | (Pa) | (W) | (°C) |
| 1 | 130 | 50 | 0 | 0.3 | 200 | 110 |
| 2 | 0 | 0 | 60 | 0.3 | 500 | 110 |
| 3 | 0 | 0 | 60 | 0.3 | 100 | 110 |

FIG. 12D

| GAS FLOW RATE (ml/min) | PROCESSING PRESSURE | HIGH FREQUENCY BIAS POWER | TEMPERATURE OF ELECTRODE 6 |
|---|---|---|---|
| $NH_3$ | (Pa) | (W) | (°C) |
| 60 | 0.3 | 500 | 110 |

PLASMA ETCHING METHOD

BACKGROUND OF THE INVENTION

The present invention relates to a plasma etching method using a plasma etching apparatus, and particularly to a method applicable to plasma etching on a multilayered film where a magnetic tunnel junction element is formed.

In recent years, a surface recording density is increasing rapidly by shifting from Giant Magneto Resistance (GMR) technology to Tunnel Magneto Resistance (TMR) technology in order to deal with a hard disk drive having a larger capacity. Accordingly, a magnetic head used for the hard disk drive is needed to be miniaturized, and microfabrication technology is demanded for the magnetic head. Therefore, application of an ion milling apparatus to a plasma etching apparatus is in progress for a magnetic head manufacturing device.

A magnetic head manufacturing method uses as a mask a photoresist formed by lithography similar to the semiconductor device and performs plasma etching to microfabricate a non-volatile material such as $Al_2O_3$; NiFe or Ru as well as a material such as $SiO_2$, Ta or Cr often applied to the semiconductor device formed on a substrate.

In recent years, microfabrication makes it possible to reduce the linewidth of a material to be etched by reducing a photoresist, which is formed by lithography, by plasma etching before fabricating the material to be etched, and performing plasma etching on the material to be etched using the reduced mask pattern.

As a method of reducing the linewidth, for example, JP-A-9-237777 (corresponding to EP 0753885(A1)) discloses a method that a photoresist patterned by lithography is reduced by isotropic or partially isotropic etching to form a reduced linewidth patterned photoresist with a buried antireflection coating which functions as an etch stop or a dummy layer. The reduced linewidth pattern provides an etching mask for anisotropy etching that is subsequent to an underlying material such as polysilicon, metal, insulator or a ferroelectric substance.

JP-A-2001-196355 discloses a method that performs exposure and development of a photoresist film which is formed on an antireflection film made of an organic substance and etches the antireflection film with a mixed gas of $Cl_2$, HBr, $O_2$ and Ar. JP-A-10-98029 (corresponding to EP 0820093(A1)) discloses a method using a mixed gas of HBr and $O_2$, and JP-A-2007-329505 discloses a method using a mixed gas of $SO_2$ and He.

SUMMARY OF THE INVENTION

When the antireflection film is etched, the surface layer portion of the photoresist pattern is also etched and the pattern is reduced. Thus, the pattern with a linewidth finer than that of the photoresist pattern just after the development can be formed. However, JP-A-9-237777 has disadvantages that it is necessary to secure a photoresist mask amount required for fabrication of an inorganic film layer and that the reduction of the linewidth is limited.

According to JP-A-2001-196355, JP-A-10-98029 and JP-A-2007-329505, a stress is applied to the photoresist pattern by the protection film of the reaction product adhered to the side wall of the photoresist pattern, or the photoresist resin is damaged by a chemical action of halogen gas When the linewidth is large, the stress or the damage due to the chemical action that the photoresist pattern receives does not appear, but if the linewidth of the photoresist pattern after the reduction becomes 35 nm or less, problems such as deformation and collapse of the photoresist pattern might occur.

Therefore, the present invention provides a plasma etching method that reduces a film to be etched to a size smaller than a patterned size and can reduce the size without causing disconnection or bending of the film to be etched caused by the size reduction.

The present invention relates to a plasma etching method for plasma etching a film to be etched to a size smaller than a prescribed size using a mask which is patterned to the prescribed size, including the step of etching the film to be etched to the size smaller than the prescribed size while forming a protection film on side walls of the film to be etched.

The present invention also relates to a plasma etching method for plasma etching a chromium film to a size smaller than a prescribed size using a mask patterned to the prescribed size by an induction coupling plasma etching apparatus provided with a Faraday shield, including the step of etching the chromium film with a mixed gas of chlorine gas and oxygen gas while applying a radio frequency voltage to the Faraday shield.

In the plasma etching method that reduces the film to be etched to the size smaller than the patterned size, the present invention can reduce the size without causing disconnection or bending of the film to be etched caused by the size reduction.

Other objects, features and advantages of the invention will become apparent from the following description of the embodiments of the invention taken in conjunction with the accompanying drawings.

BRIEF DESCRIPTION OF THE DRAWINGS

FIGS. 6A to 6C are views showing an effect of each radio frequency voltage applied to a Faraday shield on an etching shape.

FIGS. 8A to 8C are views showing an etching shape of a Ta film with respect to each film thickness of the mask.

FIGS. 12A to 12D are views showing tables representing etching conditions of respective embodiments according to the invention.

DETAILED DESCRIPTION OF THE EMBODIMENTS

One embodiment of the plasma etching method according to the present invention is described below with reference to the drawings. As a plasma etching processing apparatus applied to the invention, there was used a plasma processing apparatus that performs plasma etching on a film to be etched, which is used as a sample and formed on a substrate, and performs etching on a metallic film or the like which is formed on the substrate by generating gas plasma upon receiving the supply of a plasma forming gas.

Figure 1:
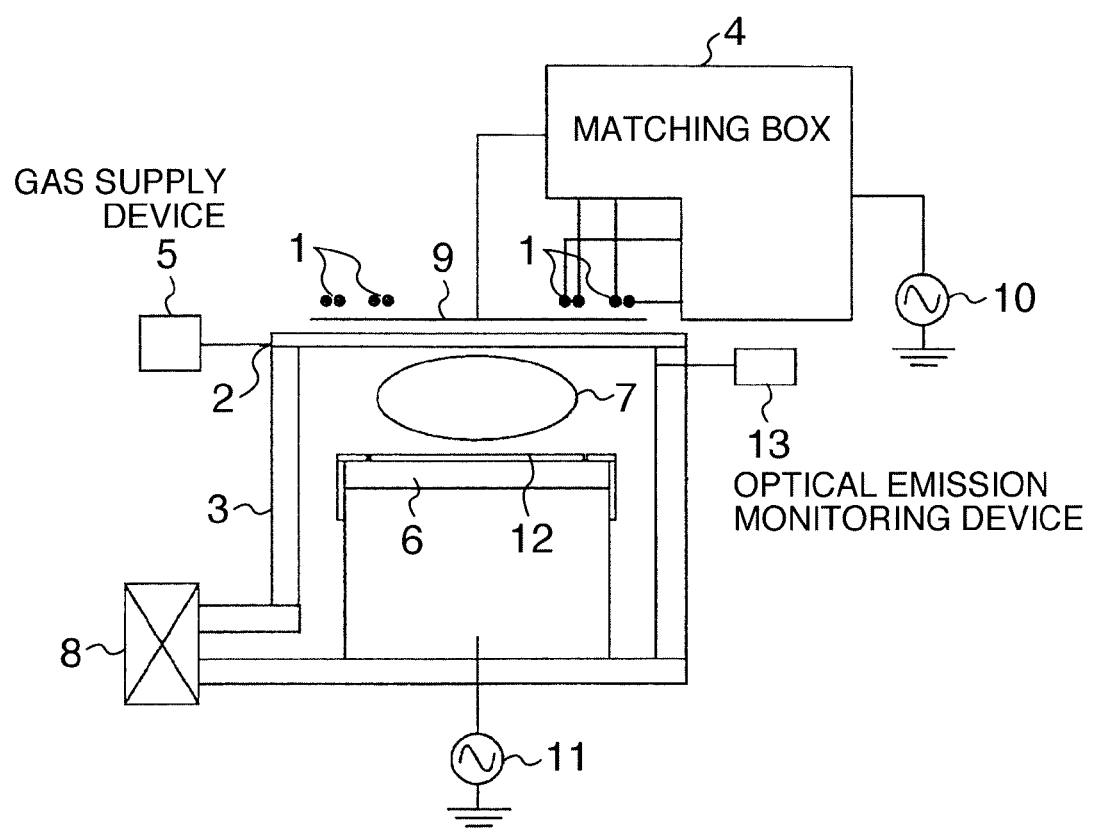
FIG. 1 is a schematic sectional view of a plasma etching apparatus to which the present invention is applied.

FIG. 1 is a sectional view schematically showing an inside structure of the plasma etching apparatus to which the invention is applied. An upper part of an etching processing chamber 3 which is a plasma etching processing chamber is airtightly sealed with a dielectric window 2 which is made of a dielectric material of quartz ($SiO_2$) or ceramic ($Al_2O_3$). And, the etching processing chamber 3 has therein an electrode 6 on which a sample 12 is positioned as a member to be processed and to which a radio frequency bias is applied through an insulating material. And the etching processing chamber 3 is grounded.

A coil-shaped induction coupling antenna 1 that radiates an induction magnetic field for generating a plasma and a first radio frequency power source 10 that supplies a radio frequency power to the induction coupling antenna 1 through a matching box 4 are arranged above the dielectric window 2. A process gas is supplied from a gas supply device 5 into the etching processing chambers 3, decompressed to a specified pressure and exhausted by an exhaust device 8. The process gas is supplied from the gas supply device 5 into the etching processing chambers 3, and the process gas is converted into plasma by the induction magnetic field radiated from the induction coupling antenna 1.

To introduce ions present in plasma 7 onto the sample 12, a radio frequency bias power is supplied to the electrode 6 by a second radio frequency power source 11. This plasma etching apparatus has a structure for etching on a non-volatile etching material and makes it possible to suppress the deposition of the reaction product on and to remove it from the dielectric window 2 by applying a radio frequency voltage to a Faraday shield 9 which is disposed between the induction coupling antenna 1 and the dielectric window 2 and which is a capacity coupling antenna. In addition, an optical emission monitoring device 13 detects a change in the light emission intensity of the etching gas or light emission intensity of the reaction product to determine the termination of etching.

Figure 2:
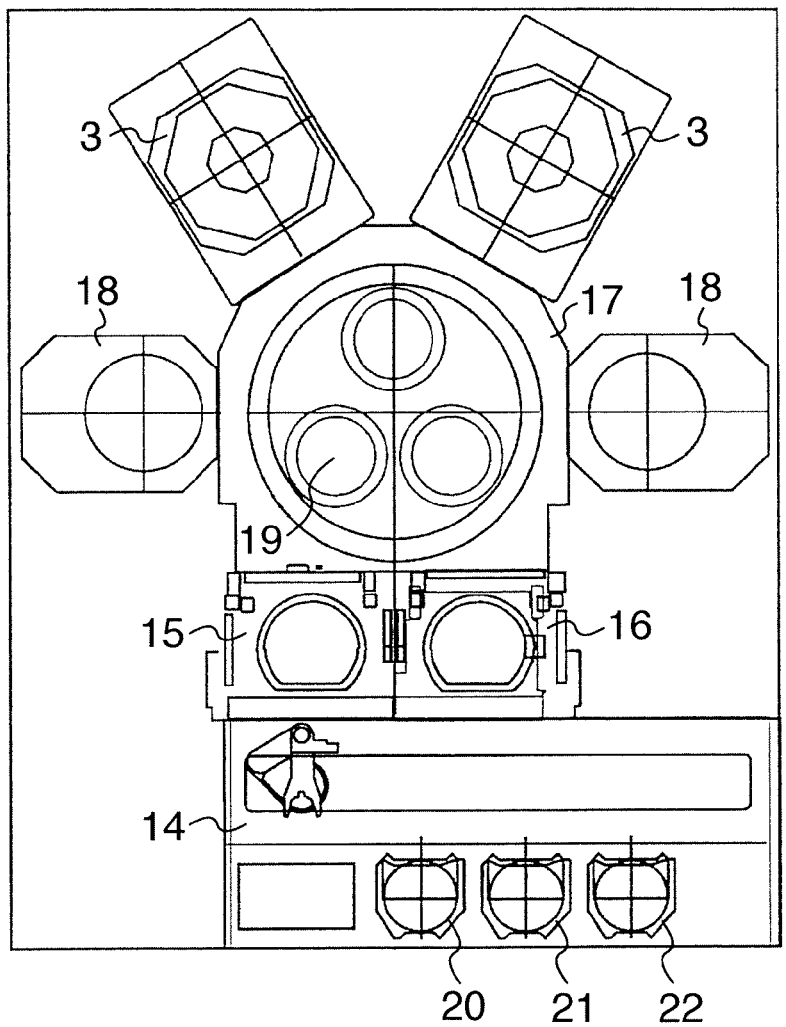
FIG. 2 is a whole configuration view of the plasma etching apparatus according to the invention.

FIG. 2 shows a whole configuration of the plasma etching apparatus to which the present invention is applied. An atmospheric loader 14 is connected to a load lock chamber 15 and an unload lock chamber 16, and the load lock chamber 15 and the unload lock chamber 16 are connected to a vacuum conveyance chamber 17. In addition, the vacuum conveyance chamber 17 is connected to the etching processing chambers 3 and ashing processing chambers 18.

The sample 12 is conveyed by the atmospheric loader 14 and a vacuum transfer robot 19, etched in the etching processing chamber 3 and ashed in the ashing processing chamber 18. The atmospheric loader 14 has thereon a first cassette 20 where the sample 12 is mounted, a second cassette 21 where the sample 12 is mounted, and a third cassette 22 where a dummy sample is mounted. The sample 12 is conveyed any time to the etching processing chamber 3, undergone etching processing or ashing processing, and returned to the first cassette 20 or the second cassette 21.

Embodiments of the plasma etching method of the invention are described below.

First Embodiment

Figure 4:
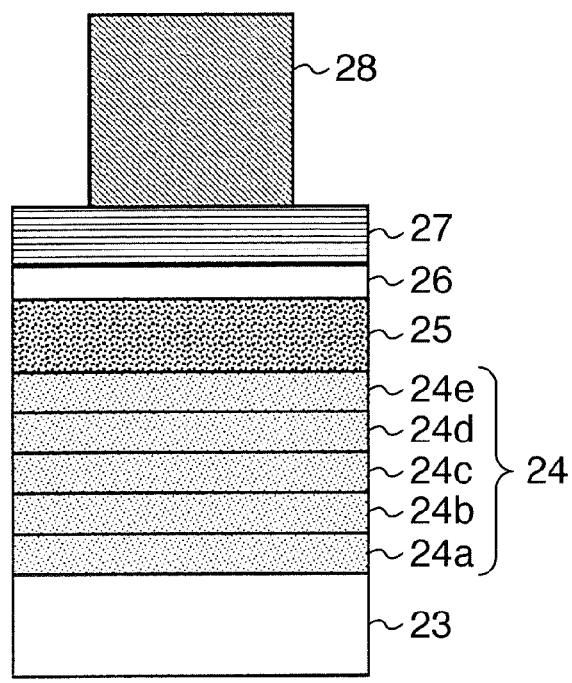
FIG. 4 is a view showing the structure of a sample used in the invention.

First, a structure example of the sample used in one embodiment of the invention is described. As shown in FIG. 4, an AlTiC substrate 23 is formed thereon from below a Ta film 24a which is a tantalum film, a first magnetic film 24b, a MgO film 24c which is a magnesium oxide film, a second magnetic film 24d, a Ru film 24e which is a ruthenium film, a Ta film 25 (50 nm) which is a tantalum film, a Cr film 26 (5 nm) which is a chromium film, an antireflection film 27 (60 nm) and a photoresist film 28 previously patterned by lithography technology or the like.

And, a multilayered film consisting of the Ta film 24a, the first magnetic film 24b, the MgO film 24c, the second magnetic film 24d and the Ru film 24e is a multilayered film where an MTJ (Magnetic Tunnel Junction) element is formed. An MTJ film is a multilayered film where the MTJ element is formed. And, the first magnetic film 24b and the second magnetic film 24d are films containing any one or an alloy of Fe, Cr and Co In addition, their structures are shown as one embodiment, and kinds, thickness, order and the like of the films to be laminated are appropriately changed in accordance with the usage. It was determined in this embodiment that the MTJ film 24 has a thickness of 30 nm, and a mask of the photoresist film 28 has a linewidth of 60 nm.

Subsequently, the plasma etching method that reduces the size of the Cr film 26 to a level smaller than the patterned size is described. For example, as shown in FIG. 12A, the antireflection film 27 and the Cr film 26 are collectively etched under etching conditions that a mixed gas of chlorine ($Cl_2$) gas of 60 ml/min and oxygen ($O_2$) gas of 5 ml/min is used, a processing pressure is 0.3 Pa, a radio frequency bias power is 15 W, and a radio frequency voltage applied to the Faraday shield is 50 V Normally, different etching conditions are used for the antireflection film 27 and the Cr film 26, but the antireflection film 27 and the Cr film 26 are collectively treated in this embodiment because switching of the etching conditions is difficult when a selection ratio (value resulting from dividing an etching rate of the Cr film by that of the antireflection film) between the antireflection film 27 and the Cr film 26 is low and the Cr film 26 is a thin film of 5 nm.

The etching processing on the Cr film 26 detects a point of time when the Cr film 26 starts to disappear, namely when the Ta film 25 arranged below it starts to appear, by the optical emission monitoring device 13 or the like and terminates according to the termination of etching on the detected Cr film 26. At this time, the light emission intensity of the reaction product which emits light, for example, emission of light having a wavelength of 359 nm, is caught to detect a point of time when an emission change of light having a wavelength of 359 nm starts or terminates, and it is determined as the termination of etching on the Cr film 26.

And, the optical emission monitoring device 13 is not necessarily required when an etching rate of the Cr film 26 is checked in advance and an etching time of the Cr film 26 is determined. But, if timing of terminating the etching on the Cr film 26 delays, etching is sharply accelerated in the direction of the side wall of the photoresist film 28, and the photoresist pattern is deformed or collapsed. It is because when the Cr film 26 disappears, the oxygen radicals in the plasma concentrate on the photoresist film 28 and the antireflection film 27 and overreact. Therefore, when the linewidth of the Cr film 26 is reduced, it is necessary to change the etching conditions so that the photoresist film 28 and the antireflection film 27 do not deform or collapse.

Generally, when it is determined that the process gas has a low flow rate, and particularly when the $O_2$ gas content is reduced, an etching rate in a horizontal direction can be delayed even if timing of the termination of etching delays.

But, when the O$_2$ gas content is reduced, the chlorine radicals in the plasma react with the Ta film 25 disposed below the Cr film 26 to generate a Ta$_x$Cl$_y$-based reaction product.

When the reaction product adheres to the side wall of the photoresist film, reduction is disturbed, and a desired linewidth cannot be obtained. And the photoresist pattern is deformed or collapsed due to the weight of the reaction product adhered to the side wall of the photoresist film 28. Therefore, for optimization of the process gas flow rate by lowering of the O$_2$ gas flow rate, it becomes necessary to achieve both of overreaction by the oxygen radicals and suppression of generation of the reaction product. However, since the overreaction by the oxygen radicals and the suppression of generation of the reaction product are in a trade-off relation, the reduction of the linewidth of the Cr film 26 is limited.

Therefore, in order to reduce the linewidth of the Cr film 26 without causing deformation or collapse of the photoresist pattern, it is necessary to repeat the protection film formation on the side wall of the photoresist film 28 and etching in the direction of the side wall of the photoresist film 28 while maintaining an optimum balance so that the protection film is deposited in a certain amount on the side wall of the photoresist film 28 and the photoresist film 28 does not have a thick linewidth or etching in the direction of the side wall of the photoresist film 28 proceeds.

To repeat the protection film formation on the side wall of the photoresist film 28 and the etching in the direction of the side wall of the photoresist film 28 while maintaining the optimum balance, the antireflection film 27 and the Cr film 26 were etched while applying a radio frequency voltage of 50V to the Faraday shield 9 in this embodiment. Thus, the Cr film 26 can be reduced and a desired linewidth can be obtained without causing deformation or collapse of the photoresist pattern. Its reasons are assumed as follows.

Normally, the reaction product generated by etching is exhausted by the exhaust device 8 or adheres to the interior of the etching processing chamber 3, the side of the dielectric window 2 opposite to the electrode 6, the circuit surface forming the pattern of the sample 12 or the side wall of the circuit. The reaction product is positively deposited on the side walls of the photoresist film 28 as a mask material, the antireflection film 27 as an etching material and the Cr film 26 as an etching material to form the protection film. Thus, the pattern side walls are hardened, and deformation or collapse does not occur. At this time, the radio frequency voltage is applied to the Faraday shield 9 as a means for positively depositing the reaction product on the side walls. Thus, the deposition of the reaction product on the dielectric window 2 is hindered, and the reaction product, which has nowhere to go, returns to the sample 12 and deposits readily on the side walls.

When the radio frequency voltage applied to the Faraday shield 9 is increased, the reaction product returning to a wafer increases, and the deposition amount also increases. Therefore, the linewidth of the pattern can be controlled to an optional width by controlling the radio frequency voltage applied to the Faraday shield 9. The present invention is desirable that the radio frequency voltage applied to the Faraday shield 9 is in a range of 50V to 200V. Its reasons are as follows.

Etching shapes when the radio frequency voltage applied to the Faraday shield is changed are shown in FIGS. 6A to 6C. FIG. 6A shows an etching shape when the radio frequency voltage applied to the Faraday shield is 10V, FIG. 6B shows an etching shape when the radio frequency voltage applied to the Faraday shield is 50V, and FIG. 6C shows an etching shape when the radio frequency voltage applied to the Faraday shield is 250V.

In FIG. 6A, when the reduction of the linewidth is progressed as described above, etching in the side wall direction is accelerated, and particularly etching in the direction of the side walls of the antireflection film 27 proceeds easily, and disconnection and bending occur. In FIG. 6B, when the radio frequency voltage applied to the Faraday shield is increased, the deposition of the reaction product on the dielectric window 2 is suppressed, and the reaction product 29 deposits easily on the photoresist pattern side walls accordingly. Thus, the reaction product 29 is repeatedly deposited on and removed from the photoresist pattern side walls, and etching in the side wall direction of the antireflection film 27 is reduced. And it becomes possible to reduce the linewidth without occurrence of falling of the photoresist pattern.

Figure 5:
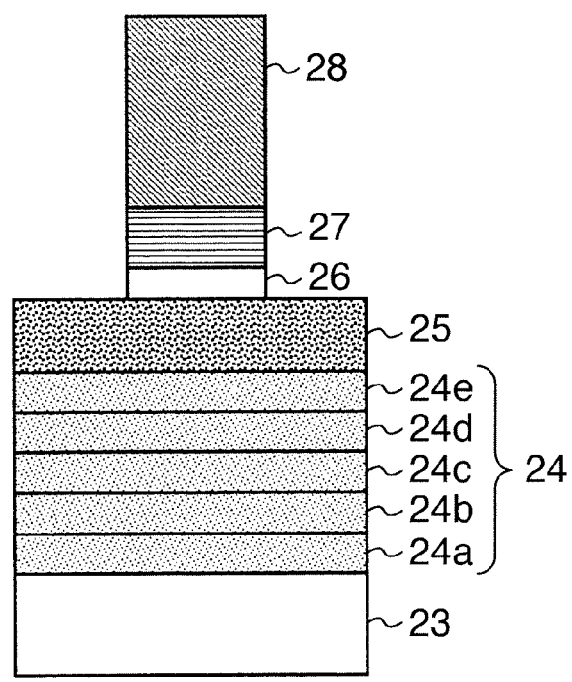
FIG. 5 is a view showing a result of etching a Cr film by the plasma etching method of the invention.

In FIG. 6C, when the radio frequency voltage applied to the Faraday shield is further increased, the deposition of the reaction product 29 on the photoresist pattern side walls increases and the deposition of the reaction product 29 is larger than the etching in the side wall direction, so that the linewidth becomes larger than the mask pattern. Therefore, the present invention determines that the radio frequency voltage applied to the Faraday shield 9 is in a range of 50V to 200V, so that the linewidth can be reduced without causing deformation or collapse of the photoresist pattern. In this embodiment, the antireflection film 27 and the Cr film 26 are collectively plasma etched under etching conditions that a mixed gas of chlorine (Cl$_2$) gas of 60 ml/min and oxygen (O$_2$) gas of 5 ml/min is used, a processing pressure is 0.3 Pa, a radio frequency bias power is 15 W, and a radio frequency voltage applied to the Faraday shield is 50V as shown in FIG. 12A. As a result, the linewidth of the Cr film 26 could be reduced from an initial linewidth of 60 nm of the photoresist film to 30 nm without causing deformation or collapse of the photoresist pattern as shown in FIG. 5.

In this embodiment, the multilayer film of the antireflection film and the Cr film was described as the material to be etched. But the present invention is not limited to the material for the material to be etched and the film structure. In addition to the metallic films, it also becomes possible to reduce the linewidth without causing deformation or collapse of the pattern by using for example an inorganic film, an organic film or a hybrid film of the inorganic film and the organic film and repeating formation of the protection film and etching in the side wall direction while maintaining an optimum balance. But, it is necessary to optimize properly the etching conditions depending on the material for the material to be etched.

In this embodiment, the radio frequency voltage is applied to the Faraday shield as a means for deposition of the protection film positively on the pattern side walls. But the means for deposition of the protection film positively on the pattern side walls in the present invention is not limited to the means for applying the radio frequency voltage to the Faraday shield. For example, there may be used a means for adding a depositing gas with which the side wall protection film is formed easily. Otherwise, it may be a means for applying a radio frequency bias to a susceptor which is mounted on the outer periphery of the sample 12 with metal sprayed to its rear surface. In such a case, ions are positively drawn into the susceptor, and the reaction product having nowhere to go returns to the sample 12 and easily deposits on the side walls.

In addition, since the present invention is not limited to the means based on the Faraday shield as described above, a plasma etching processing apparatus (for example, a capacity coupling plasma etching apparatus, a microwave plasma etching apparatus of an ECR (Electron Cyclotron Resonance) system, a helicon plasma etching apparatus, a dual frequency excitation parallel plate plasma etching apparatus, etc.) not provided with the Faraday shield may be used. And it becomes possible to reduce the linewidth without occurrence of deformation or collapse of the pattern by repeating the formation of the protection film and the etching in the direction of the pattern side walls while maintaining an optimum balance.

And, not to deposit the reaction product asymmetrically on the pattern side walls of the material to be etched, it is desirable to dispose the sample 12 on the electrode 6 such that a wiring direction of the mask pattern formed on the sample 12 and a direction of a gas flow of the etching gas exhausted by the exhaust device 8 become parallel to each other. And, to prevent the pattern of the material to be etched from falling, it is desirable that a pressure difference is not generated between the vacuum conveyance chamber 17 and the etching processing chamber 3 without purging an inert gas to the vacuum conveyance chamber 17.

Further, to prevent the pattern of the material to be etched from falling, it is desirable that when the processed sample 12 is returned from the unload lock chamber 16 to the first cassette 20 or the second cassette 21, the processed sample 12 is disposed in the unload lock chamber 16, and after 60 seconds or more has passed, a vacuum pressure is returned to an atmosphere pressure.

As described above, in the plasma etching method that reduces the etching size of the material to be etched to the size smaller than the patterned size, the plasma etching method of the present invention can reduce the size of the material to be etched without causing disconnection or bending of the wiring of the material to be etched due to the size reduction of the material to be etched.

Then, another embodiment applying the plasma etching method according to the present invention described in the above embodiment is described below.

Second Embodiment

First, a structure example of the sample used in one embodiment of the invention is described. As shown in FIG. 4, an AlTiC substrate 23 is formed thereon from below a Ta film 24a which is a tantalum film, a first magnetic film 24b, a MgO film 24c which is a magnesium oxide film, a second magnetic film 24d, a Ru film 24e which is a ruthenium film, a Ta film 25 (50 nm) which is a tantalum film, a Cr film 26 (5 nm) which is a chromium film, an antireflection film 27 (60 nm) and a photoresist film 28 previously patterned by lithography technology or the like.

And, a multilayered film consisting of the Ta film 24a, the first magnetic film 24b, the MgO film 24c, the second magnetic film 24d and the Ru film 24e is a multilayered film where an MTJ (Magnetic Tunnel Junction) element is formed. An MTJ film is a multilayered film where the MTJ element is formed. And, the first magnetic film 24b and the second magnetic film 24d are films containing any one or an alloy of Fe, Cr and Co. In addition, their structures are shown as one embodiment, and kinds, thickness, order and the like of the films to be laminated are appropriately changed in accordance with the usage. It was determined in this embodiment that the MTJ film 24 has a thickness of 30 nm, and a mask of the photoresist film 28 has a linewidth of 60 nm.

Figure 3:
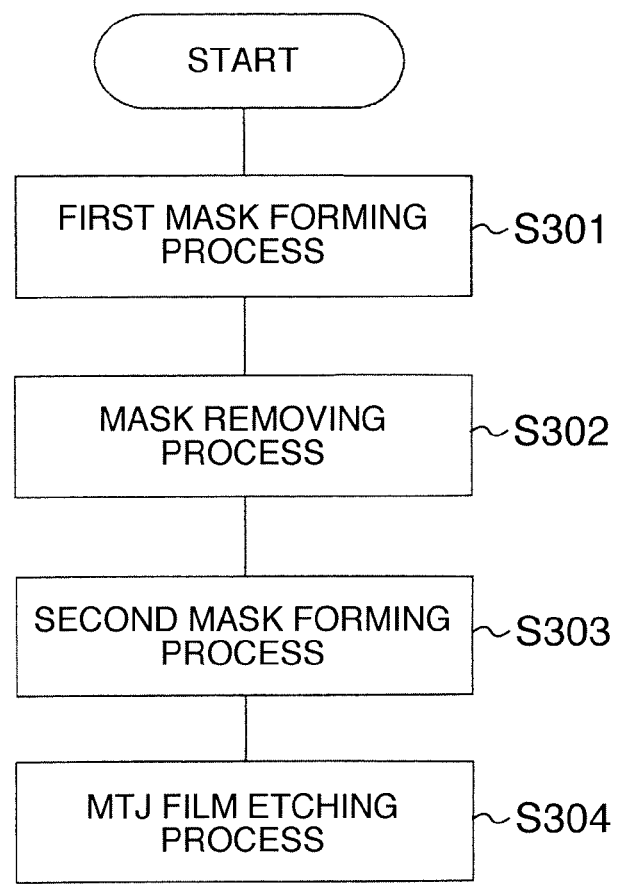
FIG. 3 is a flow chart showing a plasma etching method of the invention.

Subsequently, the plasma etching method of the invention according to this embodiment is described with reference to the flow chart shown in FIG. 3. When the plasma etching method according to the invention is started, first a first mask forming process of step 301 (S301) performs etching on an antireflection film and a chromium film with a mixed gas including chlorine gas and oxygen gas while reducing to a size smaller than the patterned size with a previously patterned photoresist used as a mask.

Then, the photoresist and the antireflection film are removed in a mask removing process of step 302 (S302). Subsequently, a second mask forming process of step 303 (S303) performs etching with a mixed gas including chlorine gas, methane tetrafluoride ($CF_4$) gas and helium gas with the chromium film used as a mask while reducing the tantalum film to a size smaller than the linewidth of the chromium film of the mask formed in step 301 (S301). Last, an MTJ film etching process of step 304 (S304) performs etching on the MTJ film with ammonia gas with the reduced multilayered film of the chromium film and tantalum film used as a mask to provide the MTJ film with the same linewidth as the mask of the multilayered film. Each step described above is described below in details.

First, the first mask forming process (S301) is performed to form the first mask on the sample having the above-described structure as shown in FIG. 4 For example, the first mask shown in FIG. 5 can be formed by collectively etching the antireflection film 27 and the Cr film 26 in the same way as in The first embodiment under etching conditions that a mixed gas of chlorine ($Cl_2$) gas of 60 ml/min and oxygen ($O_2$) gas of 5 ml/min is used, a processing pressure is 0.3 Pa, a radio frequency bias power is 15 W, and a radio frequency voltage applied to the Faraday shield is 50V.

Then, the mask removing process (S302) is performed to remove the photoresist film 28 and the antireflection film 27. Since the Ta film 25 just below the Cr film 26 has low volatility, the reaction product generated at the time of etching is apt to deposit on the pattern side walls. Therefore, if the mask is thick, the reaction product deposits in a larger amount on the pattern side walls, and the pattern is apt to be deformed and collapsed. It is therefore preferable that the mask is thin as much as possible when the Ta film 25 is etched.

Figure 7:
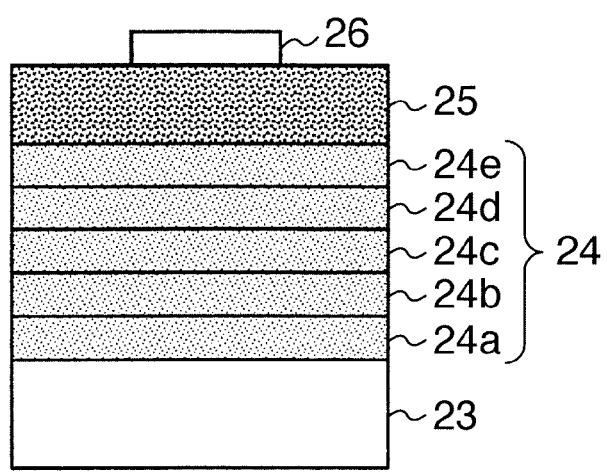
FIG. 7 is a view showing a result of processing by a mask removing process according to the plasma etching method of the invention.

Accordingly, the present invention uses as a mask material the Cr film 26 having high selectivity to the Ta film 25, performs etching on the Cr film 26, removes the unnecessary photoresist film 28 and antireflection film 27, and performs etching on the Ta film 25 with the thin Cr film 26 used as a mask. Thus, as shown in FIG. 7, it becomes possible to reduce the Ta film 25 and to obtain a desired linewidth without causing deformation or collapse of the pattern. The effect capable of reducing the Ta film 25 without suffering from deformation or collapse of the pattern caused by using a thin mask of the Cr film 26 is considered as follows.

The etching shape of the Ta film 25 to each film thickness of the mask is shown in FIGS. 8A to 8C. First, FIG. 8A shows an etching shape when the Ta film 25 is etched with the photoresist film 28 and the antireflection film 27 remained as they are. It is seen that the reaction product 29 deposits on the pattern side walls and the pattern is deformed and collapsed by the weight of the reaction product. Then, FIG. 8B shows an etching shape when the Ta film 25 is etched using the Cr film having the same thickness as the Ta film 25. Similar to FIG. 8A, the reaction product 29 deposits on the pattern side walls. But, since the deposition is not made high, the pattern is not deformed or collapsed, but the linewidth becomes thick and a desired linewidth cannot be obtained.

Last. FIG. 8C shows an etching shape that when the photoresist film 28 and the antireflection film 27 are completely removed, and the Ta film 25 is etched with the thickness of the Cr film 26 reduced to $\frac{1}{10}$ of that of the Ta film 25. Since the Cr film 26 is thin, the facets of the Cr film 26 are tapered slightly, the reaction product hardly deposits on the pattern side wall, and reduction of the linewidth proceeds. In view of the properties shown in FIG. 8A to FIG. 8C, it is considered that the Ta film 25 can be reduced without causing deformation or collapse of the pattern by removing the photoresist film 28 and the antireflection film 27 and reducing the thickness of the Cr film 26 to $\frac{1}{10}$ or less of the Ta film 25.

As a method of removing the photoresist film 28 and the antireflection film 27, either an in-situ ashing processing for removing in the etching processing chamber 3 or an ashing processing for removing in the ashing processing chamber 18 may be performed. And, when the remaining film amounts of the photoresist film 28 and the antireflection film 27 are small, the mask removing process is not necessarily required. And, since the reaction product adhered to the side walls can be removed by the above-described ashing processing in this embodiment, the Cr film 26 is provided with a linewidth of 25 nm.

In addition, the Cr film is used in this embodiment, but the present invention is not limited to the Cr film, and a material having high selectivity to the Ta film 25 may be used. For example, there are a single layer film of Fe, Ni, Y, Zr, Ru, Hf, Au, Ag, Cu and Al and a multilayered film containing them or their oxides. But, it is necessary to optimize the etching conditions as needed depending on the individual materials.

Then, the second mask forming process (S303) is performed to form a mask of the Ta film 25. For example, the Ta film 25 is etched under etching conditions that a mixed gas of chlorine ($Cl_2$) gas of 18 ml/min, methane tetrafluoride ($CF_4$) gas of 7 ml/min, and helium (He) gas of 50 ml/min is used, a processing pressure is 0.3 Pa, a radio frequency bias power is 17 W, and a radio frequency voltage applied to the Faraday shield is 50 V as shown in FIG. 12B.

This second mask forming process terminates on the basis of the termination of etching on the Ta film 25 detected by the optical emission monitoring device 13 similar to the etching on the above-described Cr film 26 in The first embodiment. For example, emission of light having a wavelength of 515 nm is received, and a point of time when a change in emission of light having a wavelength of 515 nm starts or terminates is detected to determine that the detected point of time is termination of the etching on the Ta film 25. At that time, both the reduction of the Ta film 25 and the suppression of the generation of the reaction product from the MTJ film 24 which is just below the Ta film 25 must be realized in the same way as the etching on the Cr film 26 described in The first embodiment.

As a means for realizing the above, the radio frequency voltage applied to the above-described Faraday shield in The first embodiment may be increased, but since the reaction product of Ta has low volatility, it is hard to remove it if it adheres to the pattern side walls. Therefore, it is desirable that the reaction product is not deposited on the pattern side walls as much as possible. For that, the present invention adds helium (He) gas to chlorine ($Cl_2$) gas and methane tetrafluoride ($CF_4$) gas as shown in FIG. 12B. The deposition of the reaction product on the pattern side walls is suppressed by reducing the stay time of the gas in the etching chamber due to the addition of the helium (He) gas.

Figure 9:
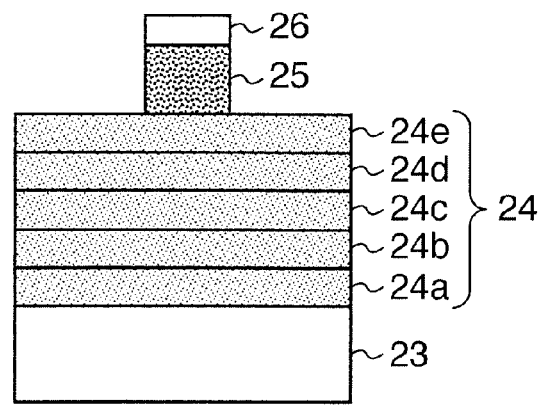
FIG. 9 is a view showing a result of etching a Ta film by the plasma etching method of the invention.

And, when the helium (He) gas is added, a ratio of the chlorine ($Cl_2$) gas flow rate to the total gas flow rate of the mixed gas is decreased because of dilution by the helium (He) gas, and the generation of the reaction product when the MTJ film 24 just below the Ta film 25 is revealed can be suppressed, and the etching shape shown in FIG. 9 can be obtained. At that time, the Ta film 25 has a linewidth of 20 nm. For etching the Ta film 25, methane tetrafluoride ($CF_4$) gas was used, but for example fluorine-containing gas such as methane trifluoride ($CHF_3$) gas, methane bifluoride ($CH_2F_2$) gas or sulfur hexafluoride ($SF_6$) may be used. But, it is necessary to optimize properly the etching conditions depending on a kind of gas. Last, the MTJ film etching process (S304) for plasma etching the MTJ film 24 is performed using as a mask the reduced Cr film 26 and Ta film 25. When the MTJ film 24 is etched and the etching is desired to be terminated at, for example, the Ta film 24a or the MgO film 24c which is in the MTJ film 24 using the optical emission monitoring device 13, the sample has a partly non-etched portion if the timing of terminating the etching is early, and the Ta film 24a or the MgO film 24c which is originally desired to be left might disappear if the timing of terminating the etching delays.

Figure 10:
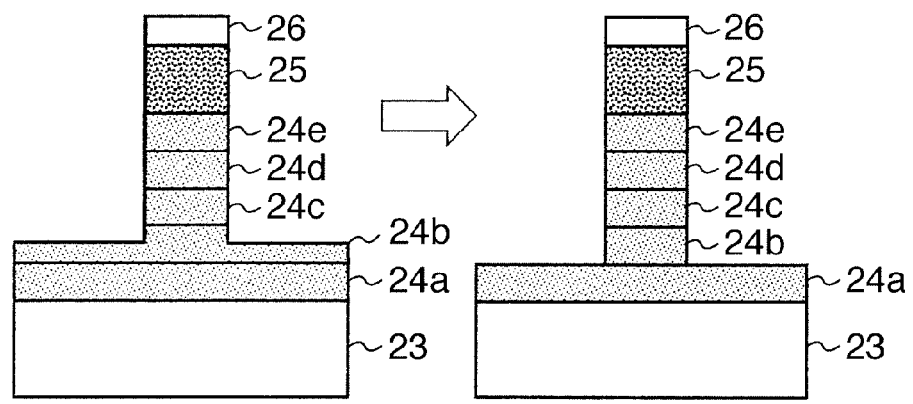
FIG. 10 is a view showing a result of etching an MTJ film by the plasma etching method of the invention.

Therefore, this embodiment can obtain a desired linewidth without causing a non-etched portion or disappearance of the Ta film 24a as shown in FIG. 10 by etching to a middle of the first magnetic film 24b in the MTJ film 24 by the first radio frequency bias power and subsequently etching the remaining first magnetic film 24b to the Ta film 24a by a radio frequency bias power lower than the first radio frequency bias power. Otherwise, a desired linewidth can also be obtained without causing a non-etched portion or disappearance of the MgO film 24c by etching to a middle of the second magnetic film 24d by the first radio frequency bias power and subsequently etching the remaining second magnetic film 24d to the MgO film 24c by the radio frequency bias power lower than the first radio frequency bias power. This embodiment describes a method that performs etching to a middle of the first magnetic film 24b in the MTJ film 24 by the first radio frequency bias power and subsequently performs etching on the remaining first magnetic film 24b to the Ta film 24a by the radio frequency bias power lower than the first radio frequency bias power as shown in FIG. 10.

For example, as shown at step 1 in FIG. 12C, the Ru film 24e is etched under etching conditions that a mixed gas of oxygen ($O_2$) gas of 130 ml/min and argon (Ar) gas of 50 ml/min is used, a processing pressure is 0.3 Pa, a radio frequency bias power is 200 W, and the electrode 6 has a temperature of 110° C. Subsequently, the first magnetic film 24b is etched to the middle of it under etching conditions that ammonia ($NH_3$) gas of 60 ml/min is used, a processing pressure is 0.3 Pa, a radio frequency bias power is 500 W, and the electrode 6 has a temperature of 110° C. as shown at step 2 in FIG. 12C. At that time, the etching time is previously calculated by checking the etching rate of the first magnetic film 24b.

The remaining first magnetic film 24b is then etched under etching conditions that ammonia ($NH_3$) gas of 60 ml/min is used, a processing pressure is 0.3 Pa, a radio frequency bias power is 100 W, and the electrode 6 has a temperature of 110° C. as shown at step 3 in FIG. 12C, and the etching is terminated when the Ta film 24a appears. At that time, the end of etching on the first magnetic film 24b is detected by the optical emission monitoring device 13, and the etching is terminated according to the detected end of etching.

For example, emission of light having a wavelength of 656 nm is received, and a point of time when a change in emission of light having the wavelength of 656 nm starts or terminates is detected to determine that the detected point of time is termination of the etching on the first magnetic film 24b. Since the Ta film 24a below the first magnetic film 24b has high selectivity, the Ta film 24a does not disappear even when the first magnetic film 24b is overetched as needed.

The reaction product deposited on the pattern side wall when etching can be scraped off by overetching the first magnetic film 24b. Thus, an MTJ element having the same size of 20 nm as that of the mask (Ta film 25) can be formed without disappearance of the Ta film 24a and without disconnection or bending of the MTJ film 24.

Figure 11:
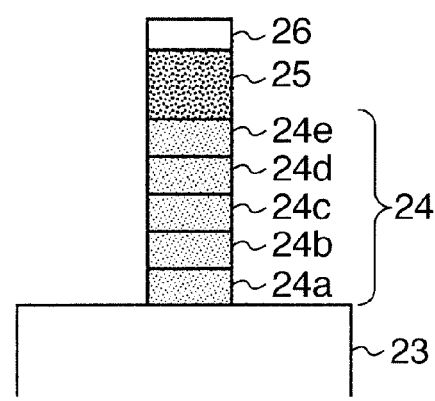
FIG. 11 is a view showing a result of etching an MTJ film by the plasma etching method of the invention.

Then, a method of forming the MTJ element by etching the Ru film 24e to the Ta film 24a collectively under the same etching conditions is described below. For example, the Ru film 24e to the Ta film 24a are collectively etched under etching conditions that ammonia ($NH_3$) gas of 60 ml/min is used, a processing pressure is 0.3 Pa, a radio frequency bias power is 500 W, and the electrode 6 has a temperature of 110° C. as shown in FIG. 12D. It is preferable that the radio frequency bias power is determined to have a value in a range of 500 W to 900 W so that the reaction product does not deposit on the side walls. The above plasma etching makes it possible to realize formation of the MTJ element without disconnection or bending of the MTJ film 24 as shown in FIG. 11.

Only the ammonia ($NH_3$) gas was used in the etching conditions of FIG. 12D, but the present invention is not limited to a single gas of ammonia ($NH_3$) but may use a mixed gas of the ammonia ($NH_3$) gas mixed with, for example, an inert gas such as carbon monoxide (CO) gas, carbon dioxide gas ($CO_2$) gas, nitrogen ($N_2$) or the like. In other words, the present invention may use any gas containing ammonia ($NH_3$) gas.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma etching method for plasma etching a film to be etched to a size smaller than a prescribed size using a mask which is patterned to the prescribed size, wherein the plasma etching is conducted in an induction coupling plasma etching apparatus provided with a Faraday shield, the method comprising:
    etching the film to be etched to the size smaller than the prescribed size; and
    hardening side walls of the mask by applying a radio frequency voltage to the Faraday shield to positively deposit a protection film on the side walls, the radio frequency voltage being in a range of 50 V to 250 V.

2. The plasma etching method according to claim 1, wherein the film to be etched is a metallic film.

3. The plasma etching method according to claim 1, wherein the radio frequency voltage to be applied to the Faraday shield is controlled such that deposit on the side walls of the mask is balanced to the etching of the side walls of the mask.

4. The plasma etching method according to claim 3, wherein the film to be etched is a metallic film.

5. A plasma etching method for plasma etching a chromium film, wherein the plasma etching is conducted in an induction coupling plasma etching apparatus provided with a Faraday shield, the method comprising:
    after generating a plasma using a mixed gas of chlorine gas and oxygen gas, etching the chromium film with the mixed gas; and
    hardening side walls of the mask by applying a radio frequency voltage to the Faraday shield to positively deposit a protection film on the side walls, the radio frequency voltage being in a range of 50 V to 250 V.

6. The plasma etching method according to claim 5, wherein the radio frequency voltage to be applied to the Faraday shield is controlled such that deposit on the side walls of the mask is balanced to the etching of the side walls of the mask.

* * * * *